United States Patent
Adams et al.

(10) Patent No.: US 6,765,977 B1
(45) Date of Patent: Jul. 20, 2004

(54) OFFSET MODE PHASE LOCKED LOOP FREQUENCY SYNTHESIZER WITH REDUCED DIVIDE RATIO

(75) Inventors: Andrew R. Adams, Stanmore (AU); Stephen C. Avery, Kellyville (AU)

(73) Assignee: Cisco Technology, Inc., San Jose, CA (US)

( * ) Notice: Subject to any disclaimer, the term of this patent is extended or adjusted under 35 U.S.C. 154(b) by 95 days.

(21) Appl. No.: 10/095,662

(22) Filed: Mar. 11, 2002

Related U.S. Application Data

(60) Provisional application No. 60/277,370, filed on Mar. 19, 2001, provisional application No. 60/283,609, filed on Apr. 13, 2001, provisional application No. 60/322,416, filed on Sep. 14, 2001, and provisional application No. 60/322,575, filed on Sep. 14, 2001.

(51) Int. Cl.[7] .............................................. H03D 3/24
(52) U.S. Cl. ...................... 375/376; 375/294; 375/327; 375/375; 331/2; 331/17
(58) Field of Search .................................. 375/294, 327, 375/373, 374, 375, 376; 331/2, 17, 117 R; 324/76.23

(56) References Cited

U.S. PATENT DOCUMENTS

| | | | |
|---|---|---|---|
| 4,114,110 A | * 9/1978 | Nossen | 331/2 |
| 4,409,563 A | 10/1983 | Vandegraaf | 331/11 |
| 4,940,950 A | * 7/1990 | Helfrick | 331/2 |
| 5,068,626 A | * 11/1991 | Takagi et al. | 331/17 |
| 5,259,007 A | 11/1993 | Yamamoto | 375/120 |
| 6,265,861 B1 | * 7/2001 | Musha | 324/76.23 |
| 6,469,586 B1 | * 10/2002 | Rogers et al. | 331/117 R |

OTHER PUBLICATIONS

D. Molta and A. Foster–Webster, "Wired on Wireless: A New Class of 802.11 Devices Go the Distance", Network Computing, Mar. 12, 1999.
J. Kucera and B. Klepser, "3.6 GHz VCOs for multi–band GSM transceivers", Paper presented at the 27th European Solid–State Circuits Conference Villach, Austria, Sep. 2001.
T.P. Liu, "A 6.5 Hz Monolithic CMOS Voltage–Controlled Oscillator", in ISSCC Tech. Dig., Feb. 1999, pp 404–405.

* cited by examiner

*Primary Examiner*—Shuwang Liu
(74) *Attorney, Agent, or Firm*—Dov Rosenfeld; Inventek

(57) ABSTRACT

A phase locked loop (PLL) frequency synthesizer includes a voltage controlled oscillator (VCO) to provide a VCO frequency signal, a frequency offset circuit including a mixer accepting the VCO frequency signal and a signal from a second oscillator to produce a shifted-frequency signal having a frequency significantly lower than the VCO output frequency, a programmable divider accepting the shifted-frequency signal and dividing the frequency of the shifted-frequency signal by a settable amount, a phase detector to compare the phase of the output of the programmable divider to that of a reference oscillator and produce a phase difference signal; and a loop filter to filter a function of the phase difference to produce a control input to the VCO. The offset circuit shifts down the frequency without increasing the divide ratio of the loop as would a prescaler achieving the same frequency conversion as the frequency offset circuit.

1 Claim, 4 Drawing Sheets

OFFSET MODE PHASE LOCKED LOOP FREQUENCY SYNTHESIZER WITH REDUCED DIVIDE RATIO

RELATED PATENT APPLICATIONS

This invention claims priority of the following U.S. provisional patent applications:

U.S. Provisional Patent Application Serial No. 60/277,370 entitled SYSTEM USING SINGLE CHIP WIRELESS LAN MODEM AND SINGLE CHIP RADIO TRANSCEIVER AND APPARATI, METHODS, AND SOFTWARE PRODUCTS USED THEREIN OR THEREWITH, filed: Mar. 19, 2001, Serial No. 60/283,609, titled WIRELESS COMMUNICATION SYSTEM, filed: Apr. 13, 2001, U.S. Provisional Patent Application Serial No. 60/322,416 entitled CMOS WIRELESS TRANSCEIVER WITH PROGRAMMABLE CHARACTERISTICS, to Adams et al., filed: Sep. 14, 2001, and U.S. Provisional Patent Application Serial No. 60/322,575 entitled OFFSET MODE PHASE LOCKED LOOP FREQUENCY SYNTHESIZER WITH REDUCED DIVIDE RATIO, to Adams et al., filed: Sep. 14, 2001.

Such provisional patent applications are incorporated herein by reference.

BACKGROUND

This invention relates to phase locked loop frequency synthesizers, and in particular to a phased locked loop frequency synthesizer that operates in offset mode in cooperation with a second phase locked loop to reduce the divide ratio of the phase locked loop.

The use of a phase locked loop (PLL) as a frequency synthesizer is well documented in the literature. Often it is desired to make the frequency synthesizer programmable for different frequencies that might, for example, correspond to different channels in a wireless receiver or wireless transmitter. One conventional implementation of a circuit for doing this is shown in FIG. 2A, and includes in the feedback loop a voltage controlled oscillator (VCO), a divider (divide-by-N circuit), a phase detector to compare the phase of the output of the divider to that of a reference oscillator, a charge pump, and a loop filter. In this way the output of the VCO is divided by an integer N before it is compared to the reference input by the phase comparator. In order for the loop to lock, both the reference input and the divided VCO output must be identical in both phase and frequency. To achieve this, the loop must maintain the output of the VCO at a frequency that is N times greater than that of the reference input.

It often is desired to make the divide ratio of the divider programmable by using a programmable divider that provides slightly different frequencies, e.g. frequency channels. A programmable divider is a relatively complicated circuit that has limited frequency capability. When implemented in CMOS, for example, the programmable divider includes many MOS transistors connected to relatively few nodes, resulting in a total capacitance per node that limits the frequency capability of the programmable divider.

Wireless local area networks (WLANs) that operate at high frequencies, e.g., in the 5 GHz band, are now being introduced. See, for example, the IEEE 802.11a and the European HIPERLAN I and II standards for WLANs in the 5 GHz band. There thus is a need for wireless receivers and transmitters that operate in the 5 GHz range. Such receivers and transmitters typically use a local oscillator. There thus is a need for a frequency synthesizer that operates in the 5 GHz range. A typical CMOS programmable divider operates up to a frequency lower than 5 GHz. The inventors have found, for example, that with a standard 1.8-volt CMOS process (Taiwan Semiconductor Manufacturing Co., Ltd.), a typical programmable divider operates to about 2 GHz.

One prior art technique for building a frequency synthesizer capable of generating a signal in the 5 GHz range using a 2 GHz capable programmable divider is to add a second divider acting as a prescaler, e.g., a divide by 4 prescaler between the voltage controlled oscillator and the programmable divider as shown in FIG. 2B. The programmable divider would then only need to operate at a range of 5/4 GHz, which is within its range, e.g., for a 1.8 volt CMOS process. The overall divide ratio of the loop is then 4N where N is the divide ratio of the programmable divider.

Having a large divide ratio, however, increases the overall phase noise. The contribution to the overall phase noise of the reference oscillator, for example, might be 4N times the phase noise of the reference oscillator. The phase detector and the charge pump also make a contribution to the noise. Thus the higher the divide ratio, the higher the overall phase noise.

Thus there is a desire to minimize the overall divide ratio of the PLL in a PLL frequency synthesizer, but still use a limited-frequency programmable divider.

There is a constraint in maintaining the channel set-size requirements that also limits the architecture. For example, suppose that the comparison frequency at the phase detector is in the 5 MHz range. Because of the divide-by-4 prescaler, minimum step size will be 5×4=20 MHz, which may be too high for some applications. For example, a radio receiver or transmitter in the European UNI-3 band need have a step size of 5 MHz. This would require a comparison frequency at the phase detector of 5/4=1.25 MHz.

In a typical design, in order to avoid leakage from the reference source, a good rule of thumb is to use PLL with a loop bandwidth at most about $\frac{1}{20}^{th}$ of the comparison frequency. The 5 MHz channel requirement with the prior-art architecture of FIG. 2B would then lead to a very low loop bandwidth, e.g., 1.25 Mhz/20=60 kHz. Such a low loop bandwidth is not desirable because, for example, the dynamic response of the loop may then be poor. Consider, for example, using the PLL and switching channels. Having a relatively low loop bandwidth restricts the switchover time from one channel to another. A high bandwidth further is desirable for shaping of the phase noise spectrum to obtain some desirable phase noise reduction.

Thus there is a need for a PLL frequency synthesizer architecture that meets the phase noise, channel step size, and channel switching time requirements for WLAN (and other) applications, particular for WLANs than meet one or more of the upcoming high frequency WLAN standards.

For more information on the IEEE 802.11 and IEEE 802.11 a standards, see: ANSI/IEEE Std 802.11, 1999 Edition (ISO/IEC 8802-11:1999) Local and metropolitan area networks—Specific Requirements—Part 11: Wireless LAN Medium Access Control (MAC) and Physical Layer (PHY) Specifications, and IEEE Std 802.11a-1999 [ISO/IEC 8802-11: 1999/Amd 1:2000(E)] (Supplement to IEEE Std 802.11, 1999 Edition) Part 11: Wireless LAN Medium Access Control (MAC) and Physical Layer (PHY) specifications: High-speed Physical Layer in the 5 GHz Band. The standards are available on the Internet at several locations, including from the IEEE (www.IEEE.org) and in particular at http://grouper.ieee.org/groups/802/11/index.html.

SUMMARY

Described herein is a phase locked loop (PLL) frequency synthesizer that includes a voltage controlled oscillator (VCO) to provide a VCO frequency signal, a frequency offset circuit including a mixer accepting the VCO frequency signal and a signal from a second oscillator to produce a shifted-frequency signal having a frequency significantly lower than the VCO output frequency, a programmable divider accepting the shifted-frequency signal and dividing the frequency of the shifted-frequency signal by a settable amount, a phase detector to compare the phase of the output of the programmable divider to that of a reference oscillator and produce a phase difference signal; and a loop filter to filter a function of the phase difference to produce a control input to the VCO. The offset circuit shifts down the frequency without increasing the divide ratio of the loop as would a prescaler achieving the same frequency conversion as the frequency offset circuit.

DETAILED DESCRIPTION

The Radio Transceiver

Figure 1:
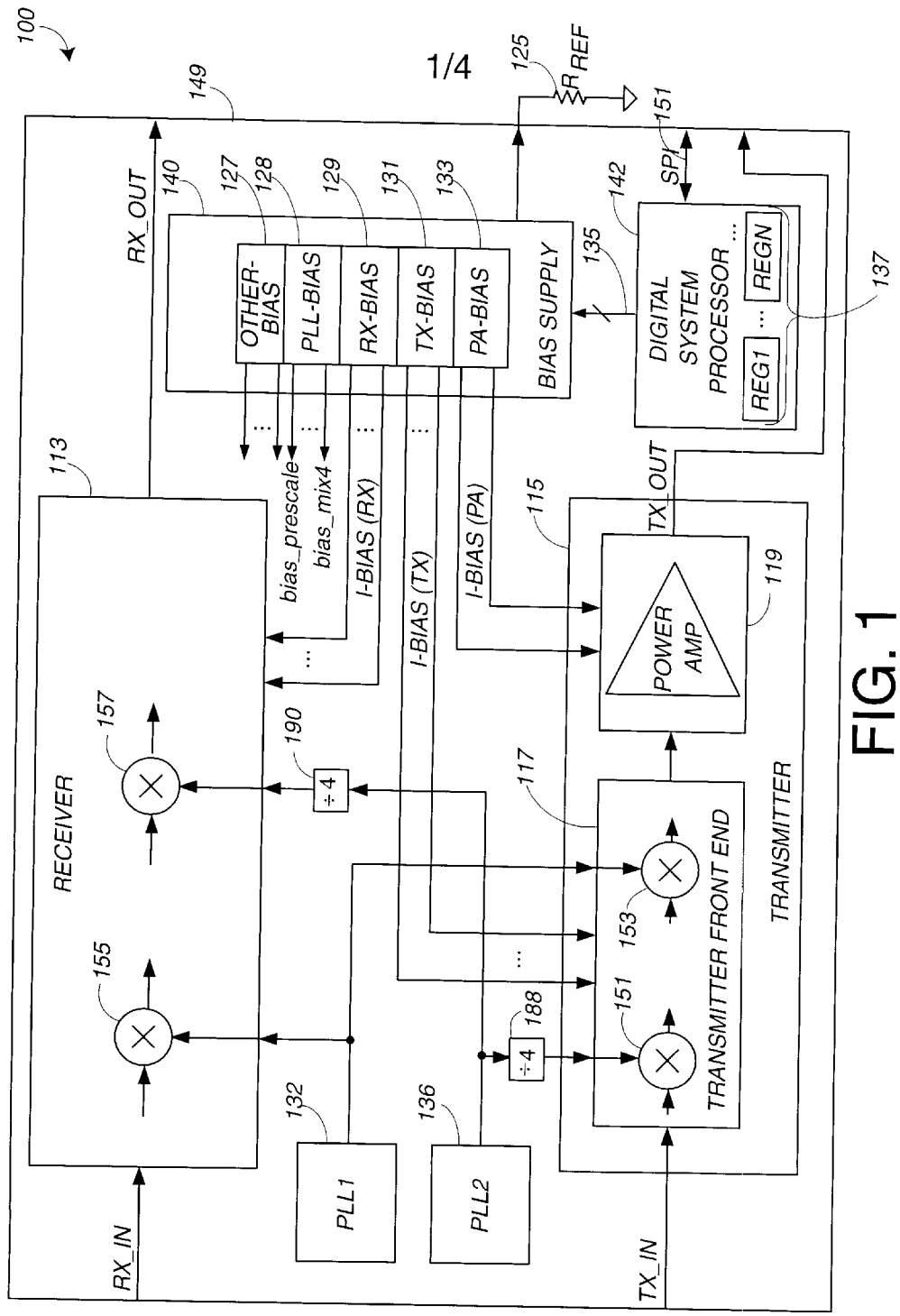
FIG. 1 shows a transceiver integrated circuit that includes a bias supply, a digital system controller, and a frequency synthesizer in accordance with an embodiment of the invention.

FIG. 1 shows as a simplified block diagram a radio transceiver monolithic integrated circuit (IC) 100 for operation in a wireless local area network. The network typically includes a plurality of wireless appliances (stations) and may also include at least one access point connected to the Internet. One or more of the stations may be mobile. Each of the stations and the access point may contain an instance of the radio transceiver IC 100

In one embodiment, the transceiver IC 100 is for operation according to the IEEE-802.11a standard protocol in the license-free national information structure (U-NII) radio spectrum bands that in the United States are assigned to 5.15–5.25, 5.25–5.35, and 5.725–5.825 GHz.

Each of the wireless stations has one or more antennas, and in one embodiment, antenna diversity is used, e.g., two or more transmit antennas or two or more receive antennas or multiple antennas for both the receive and transmit mode. Diversity switching and access-point clever diversity combining will also help in signal-fading environments.

Referring again to FIG. 1, transceiver IC 100 includes a substrate 149 and first set of analog subcircuits on the substrate forming a receiver subsystem 113 and a second set of analog subcircuits on the substrate forming a transmitter subsystem 115. The transmitter subsystem 115 further includes a transmitter front-end 117 and a power amplifier subsystem 119. The receiver subsystem 113 and transmitter front-end 117 are each in a two-stage superheterodyne configuration that includes two mixers requiring two oscillator signals. PLL1 (132) and PLL2 (136) are on-chip phase-locked loop frequency synthesizers that generate local oscillator signals for the two mixers that are included in each of receiver subsystem 113 and transmitter front-end 117. In one embodiment, each of PLL1 and PLL2 includes a voltage-controlled oscillator (VCO) and a phase error detector. PLL1 also includes a mechanism to reduce the overall divide ratio as described in more detail below.

Radio transceiver IC 100 is substantially monolithic and in one embodiment includes metal oxide semiconductor (MOS) circuitry, including CMOS analog and digital circuitry. Given the present state of semiconductor technology development, the transceiver IC 100 is implemented with CMOS technology. The present inventors have discovered that 0.18-micron CMOS technology is practical for the RF transceiver IC 100. One such silicon foundry that has the capability to manufacture such parts is Taiwan Semiconductor Manufacturing Co., Ltd.

In one embodiment, one or more intermediate frequency (IF) filters for the receiver subsystem 113 and for the transmitter front-end 117 are off-chip. The synthesizers PLL1 132 and PLL2 136 are on-chip.

Radio transceiver IC 100 includes a power supply that has a bias current supply 140 that supplies bias current to the receiver, to the transmitter front-end 117, to the power amplifier subsystem 119, and to other subcircuits.

In one embodiment, transceiver IC 100 is for half-duplex operation with mutually exclusive receive and transmit periods. In one implementation, transceiver IC 100 is for operation in a WLAN, for example a WLAN conforming to the IEEE 802.11 medium access control (MAC) specification, and in particular, a WLAN conforming to the 802.11a WLAN specification.

The embodiment of FIG. 1 includes a digital subsection that in one embodiment has a system processor 142 for controlling several aspects of the transceiver, including the bias supply 140. Processor 142 is a digital circuit that in one embodiment is on the same substrate as the receiver subsystem 113 and transmitter 117, and that includes a set of one or more—say N—registers 137, a microcontroller called the RAD16 herein, and a system processor interface (transceiver SPI) 151. The transceiver SPI, also referred to as the transceiver configuration port, provides access to the set of registers 137, and in one embodiment, is a serial port.

The digital system processor 142 provides a set of bias control signals to the bias supply. Current bias supply 140 includes a bias current supply 129 that supplies one or more bias lines to the receiver subsystem 113, a bias current supply 131 that supplies one or more bias lines to the transmitter front-end 117, a bias current supply 133 that supplies one or more bias lines to the power amplifier subsystem 119, a bias current supply 128 that supplies one or more bias lines to PLL1 and PLL2, and a bias current supply 127 that supplies one or more bias lines to other subcircuits. In one embodiment, the bias supply 140 includes a main bias generator that provides bias currents in units that are defined by an external reference resistor $R_{REF}$125. Selecting different values for $R_{REF}$ 125 is one mechanism for providing for different power levels.

In one embodiment of transceiver IC 100, the transmitter front-end 117 and the receiver 113 are implemented as a two-stage superheterodyne transmitter and two-stage superheterodyne receiver, respectively. The architecture is described in more detail in U.S. provisional patent application serial No. 60/285,775 entitled METHOD AND APPARATUS FOR REDUCING OSCILLATOR PULL IN A CMOS WIRELESS TRANSCEIVER INTEGRATED CIRCUIT to inventors Adams, et al, filed, Apr. 23, 2001, and assigned to the assignee of the present invention.

The transmit front-end subsystem has a first upconverter 151 that drives the baseband inputs of the transmitter front end to an intermediate frequency (IF). The first up-converter 151 has an oscillator input driven by the output of the synthesizer PLL2 (436) output—in one embodiment, 2.32–3.52 GHz—that is divided by 4 by a divider 188. A second up-converter 153, an RF up-converter—has an oscillator input driven by the output signal—in one embodiment, 4.41–4.55 GHz—of frequency synthesizer PLL1 132.

The receiver subsystem 113 in one embodiment receives signals over an input frequency range of 5.15–5.35 GHz, and includes a first down-converter 155 that has an oscillator input coupled to the output of synthesizer PLL1. The output of the down-converter is at an intermediate frequency in the range of range of 580–880 MHz, with PLL1 frequency in the range of 4.41–4.45 GHz. A second downconverter 157 converts the IF signal to baseband, and includes a second oscillator signal input that is coupled to the synthesizer PLL2 (136) via a by-four-divider 190. PLL2 is of frequency range 2.32–3.52 GHz in one embodiment.

The set 137 of registers in system processor 142 includes phase lock loop (PLL) main divider registers, phase locked loop tuning registers, PLL charge pump registers, PLL control registers, PLL reference divider registers, PLL lock filter registers, and PLL lock detect registers. These PLL registers are used to control and tune PLL1 132 and PLL2 136, and to detect lock conditions.

The set 137 of registers in system processor 142 also includes bias control registers for setting the bias of subcircuits in the transceiver, including bias circuits to PLL1 and PLL2 as described in more detail below. These include bias enable registers that enable or disable some of the circuits.

A control bus is used to communicate control signals from the registers in register set 137 in the digital system processor 142 to various subcircuits of the transceiver for the purpose of setting several characteristics of the transceiver. In one embodiment, the control bus is used to send control signals to the programmable bias supply 140.

The Phase Locked Loop Frequency Synthesizers

Figure 2A:
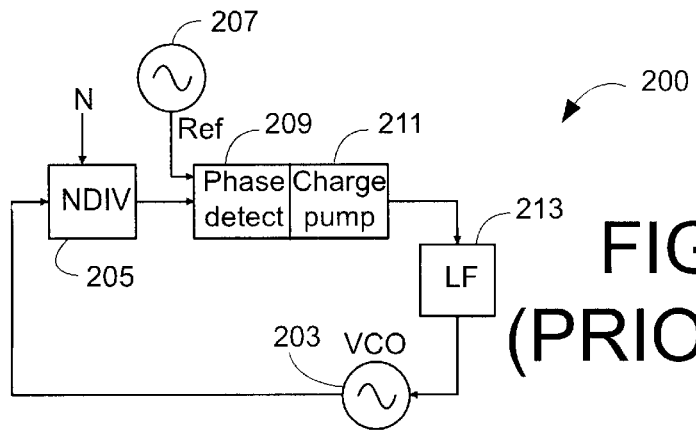
FIG. 2A shows a prior-art phase locked loop frequency synthesizer that includes a programmable divider.
Figure 2B:
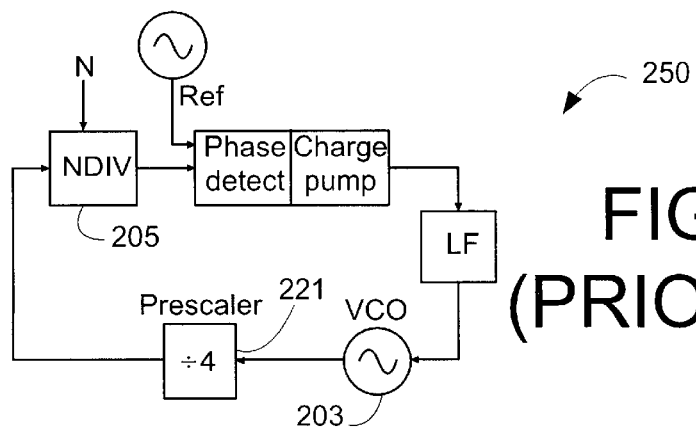
FIG. 2B shows a prior-art phase locked loop frequency synthesizer that includes a programmable divider and a prescaler.

FIG. 2A shows a prior art frequency synthesizer 200 that includes in its feedback loop a voltage controlled oscillator (VCO) 203, a programmable divider 205, a phase detector 209 to compare the phase of the output of the programmable divider to that of a reference oscillator 207, a charge pump 211, and a loop filter 213. The programmable divider provides slightly different frequencies, e.g. frequency channels. The output of the VCO may be used to drive other circuits. FIG. 2B shows another prior art PLL 250 that includes prescaler 221, e.g., a divide by 4 prescaler between the voltage controlled oscillator 203 and programmable divider 205. As explained in the background section, the programmable divider only needs to operate at a range that is a fraction—a quarter in the case of a divide-by-4 prescaler—of the VCO output frequency. The overall divide ratio, however, is high. Furthermore, it may be difficult to achieve both fine frequency control with the programmable divider, and have reasonable phase-noise performance.

Figure 3:
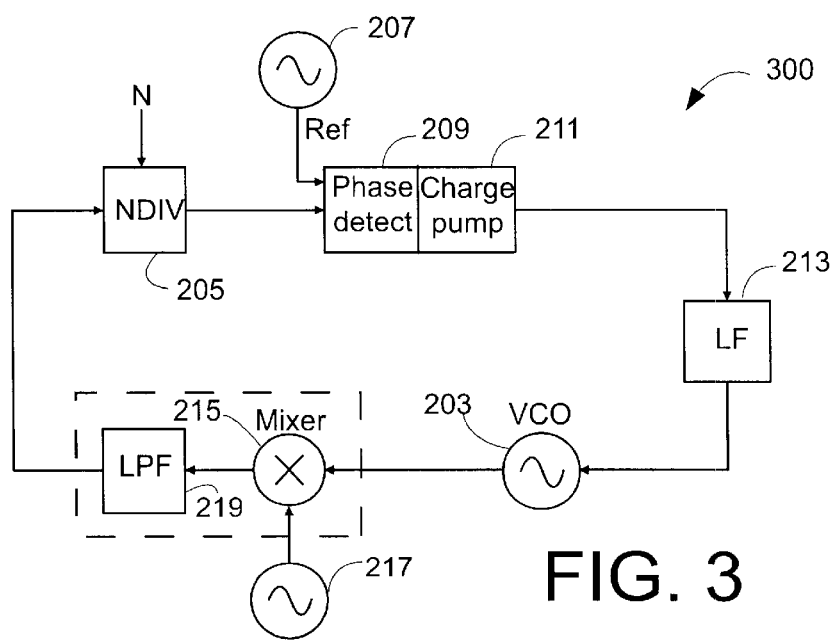
FIG. 3 shows a phase locked loop frequency synthesizer that includes a programmable divider and a mixer and second oscillator in accordance to an embodiment of the invention.

FIG. 3 shows one frequency synthesizer architecture 300 that has a reduced overall divide ratio. Rather than having a fixed prescaler such as prescaler 221 of FIG. 2B between the VCO and the programmable divider, the architecture of FIG. 3 includes a frequency offset circuit that comprises a mixer 215 using a second local oscillator 217 and a low-pass filter 219 to filter the mixer output. The mixer mixes the output of the VCO and the second local oscillator and the low pass filter 219 passes the difference-frequency product from the mixer to its output, rejecting the sum-frequency product. Thus the frequency of the VCO is lowered by the offset circuit. Using the second local oscillator 217 and the mixer 215 does not affect the in-loop bandwidth noise in the same manner as the prior-art circuit of FIG. 2B. The step size also is not the same as for the reference frequency. So, for example, in one embodiment, suppose a reference frequency of 5 MHz is chosen. A loop bandwidth, say of 300 kHz, may be selected to provide a fast channel switch time, but there still would not be leakage from the reference clock in such an architecture.

In one embodiment, the architecture 300 of FIG. 3 is used for PLL1 132, with the second local oscillator signal being a signal from the second PLL frequency synthesizer PLL2 136.

Figure 4:
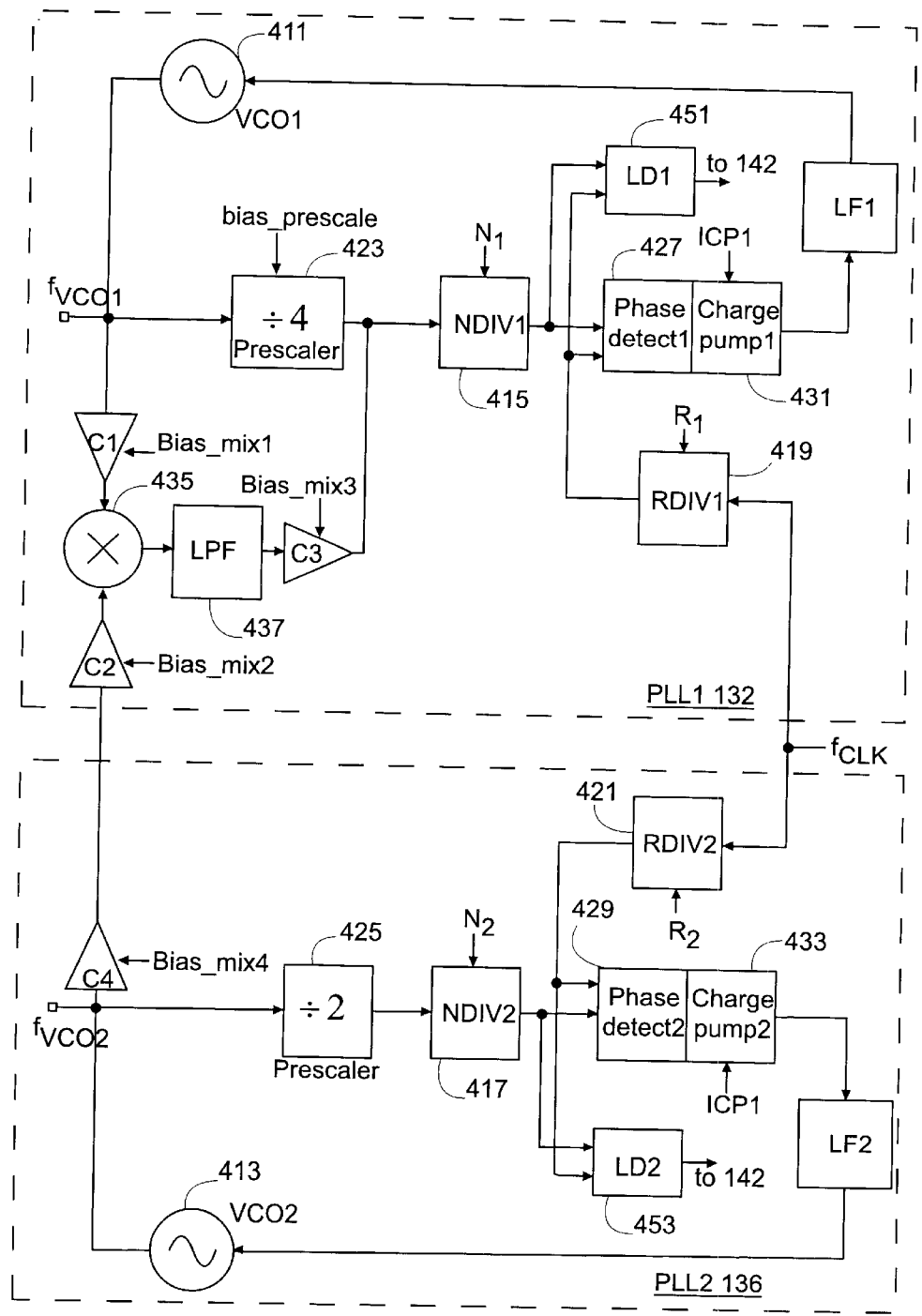
FIG. 4 shows a pair of phase locked loop frequency synthesizers that may be used in the transceiver integrated circuit of FIG. 1 in accordance to an embodiment of the invention.

FIG. 4 shows in block diagram form two phase-locked loop (PLL) based frequency synthesizers PLL1 and PLL2 that can generate the high and low frequency local oscillator signals for the mixers in the transmit front end and receive subsystem of the transceiver IC 100. Loop filters and programmable charge pump currents allow adjustment of loop bandwidths and dynamics to suit the target application.

Each synthesizer contains a low-noise voltage controlled oscillator (VCO1 411 and VC02 413), fully programmable main dividers NDIV1 415 and NDIV2 417, respectively, and fully programmable reference dividers RDIV1 419 and RDIV2 421, respectively. PLL1 includes a fixed by-4-divider 423 and PLL2 includes a fixed by-2-divider 425. Two phase detectors are included: a phase detector 427 for PLL1 and a second phase detector 429 for PLL2. The two charge pumps are designated by reference numerals 431 and 433 for PLL1 and PLL2, respectively. Also included are lock detectors 451,453 and calibration voltage detectors (not shown) for each of PLL1 and PLL2, respectively.

PLL1 also contains a mixer subsystem that includes a mixer 435 and lowpass filter 437. The mixer mixes the outputs of the two VCOs and the low pass filter 437 passes the difference-product to its output, rejecting the sum-product. The mixer subsystem is switchable, i.e., may be switched in or out of the circuit of PLL1 by switching bias supplies Bias_mix1, Bias_mix2, and Bias_mix3 to buffers C1, C2, and C3, respectively, on or off and switching bias supply bias_prescale to the prescaler 423 in the opposite direction. The PLL2 output may further be disconnected or connected to the mixer subsystem by switching on or off the bias supply Bias_mix4 of a buffer C4. The switching of the mixer subsystem in or out of PLL1 allows PLL1 132 to switchably operate in two modes, called normal mode and offset mode herein. The switching in or out of the mixer subsystem is controlled by values in registers 137 of the receiver system processor 142. The register values in turn control the operation of the programmable bias supply 140.

In normal mode, PLL1 operates in a straightforward manner similar to how PLL2 operates. bias_prescale is supplied to the prescaler 423 and the mixer subsystem bias currents are turned off so that the signal fed to the main divider (NDIV1 415) is the output of VCO1 411 divided by 4. In offset mode, no bias is supplied to the prescaler 423 and the mixer subsystem is switched into the PLL loop so that the signal fed to the main divider is the output of the mixer 435 and lowpass filter 437.

If experiments determine that the signals produced by the internal synthesizers PLL1 and PLL2 are not suitable for some of higher-order modulation schemes that require lower noise local oscillator signals, one embodiment of the frequency synthesizer provides for disabling the internal VCOs 411 and 413, and using external VCOs.

The output of PLL1 is used directly as the local oscillator signal for the high frequency (RF) mixers in the transmit front end 117 and receive subsystem 115, and in one embodiment operates over the range 4.41 to 4.55 GHz.

The output of PLL2 is divided by 4 to generate the local oscillator signal for the low frequency (IF) mixers in the transmit front end 117 and receive subsystem 115, and in one embodiment operates over the range 2.32 to 3.52 GHz to generate a local oscillator signal in the range 580 to 880 MHz.

The operating mode of the synthesizers is configured by turning circuit components on or off, as appropriate, via bits in the bias enable registers. The bias supply is described in summary form below and more fully in U.S. Provisional Patent Application Serial No. 60/322,416, titled CMOS WIRELESS TRANSCEIVER WITH PROGRAMMABLE CHARACTERISTICS, to Adams et al., filed: Sep. 14, 2001, and incorporated herein by reference.

Frequency Programming

In one embodiment, the output frequencies of the synthesizers are programmed via registers in register set 137 called the PLL main and reference divider registers. The main divide ratios, $N_1$ and $N_2$, are defined by two pairs of parameters, $P_1$ and $S_1$ for PLL1 and $P_2$ and $S_2$ for PLL2, as follows:

$$N_1 = S_1 + 8P_1 + 17,$$

and $N_2 = S_2 + 8P_2 + 17$.

The S parameters are 3-bit integers in the range 0 . . . 7, and the P parameters are 8-bit integers in the range 6 . . . 255. Thus each of PLL1 and PLL2 can achieve main divide ratios $N_1$ and $N_2$, in the range 65 to 2064.

The reference divide ratios, $R_1$ and $R_2$, are programmed via the reference divider registers of register set 137, with 8-bit integers one less than the desired divide ratios, i.e. the registers are set with $R_1-1$ and $R_2-1$ to achieve reference ratios $N_1$ and $N_2$, respectively. The reference divide ratio range is thus 1 . . . 256.

RF carrier frequency, IF filter center frequency, baseband center frequency, VCO output frequencies, and local oscillator frequencies are related as follows:

$$f_{VCO1} = f_{LO1} = f_{RF} - f_{IF}, \text{ and}$$

$$f_{VCO2} = 4 f_{LO2} = 4(f_{IF} - f_{BB}),$$

where $f_{VCO1}$ and $f_{VCO2}$ are the VCO output frequencies, $f_{LO1}$ and $f_{LO2}$ the LO frequencies, $f_{RF}$ the RF transmit and receive carrier frequency, $f_{IF}$ the IF center frequency, and $f_{BB}$ the baseband center frequency.

In one single sideband embodiment, $f_{BB}$=20 MHz, and for a second embodiment that provides I and Q outputs, $f_{BB}$=0 MHz.

In normal mode, the PLL1 output frequency $f_{VCO1}$ is related to the input clock frequency $f_{CLK}$ by $$f_{VCO1} = 4 \frac{N_1}{R_1} f_{CLK}.$$

In offset mode the governing relationship is $$f_{VCO1} = \frac{N_1}{R_1} f_{CLK} + f_{VCO2} = \left(\frac{N_1}{R_1} + 2\frac{N_2}{R_2}\right) f_{CLK}.$$

The output frequency of PLL2 is related to the clock frequency $f_{CLK}$ by $$f_{VCO2} = 2 \frac{N_2}{R_2} f_{CLK}.$$

The above equations can be manipulated to derive the relationships shown in Table 1.

TABLE 1

PLL Frequency Relationships

| | PLL1 Normal Mode | PLL1 Offset Mode | PLL2 |
|---|---|---|---|
| $f_{LO1}, f_{LO2}$ | $f_{LO1} = 4\dfrac{N_1}{R_1} f_{CLK}$ | $f_{LO1} = \dfrac{N_1}{R_1} f_{CLK} + 4(f_{IF} - f_{BB})$ | $f_{LO2} = \dfrac{1}{2}\dfrac{N_1}{R_1} f_{CLK}$ |
| $\dfrac{N_1}{R_1}, \dfrac{N_2}{R_2}$ | $\dfrac{N_1}{R_1} = \dfrac{f_{RF} - f_{IF}}{4 f_{CLK}}$ | $\dfrac{N_1}{R_1} = \dfrac{f_{RF} - 5 f_{IF} + 4 f_{BB}}{f_{CLK}}$ | $\dfrac{N_2}{R_2} = \dfrac{2(f_{IF} - f_{BB})}{f_{CLK}}$ |
| $f_{RF}$ | $f_{RF} = \left(4\dfrac{N_1}{R_1} + \dfrac{1}{2}\dfrac{N_2}{R_2}\right) f_{CLK} + f_{BB}$ | $f_{RF} = \left(\dfrac{N_1}{R_1} + \dfrac{5}{2}\dfrac{N_2}{R_2}\right) f_{CLK} + f_{BB}$ | n/a |

The Lock Detectors

Also included are lock detectors LD1 451 and LD2 453 for PLL1 and PLL2, respectively, which each generates an in-lock indication when the signal transitions of the divided VCO output occur within a settable window—between 4 and 8 ns in one embodiment—around the transitions of the divided reference clock. The width of the window is programmable via registers called the lock detect transition window registers that are part of register set 137. To compensate for any phase offset between the two signals when a loop is locked, the respective window can be advanced or retarded via registers called the lock detect VCO delay registers and lock detect reference delay registers that are part of register set 137. These registers control delay elements in the lock detector input signal paths, each providing a delay adjustment range of approximately 0–4 ns. Increasing the VCO delay or increasing the reference delay advances the transition window. Decreasing the VCO delay or decreasing the reference delay retards the window.

The Bias Supplies

Figure 5:
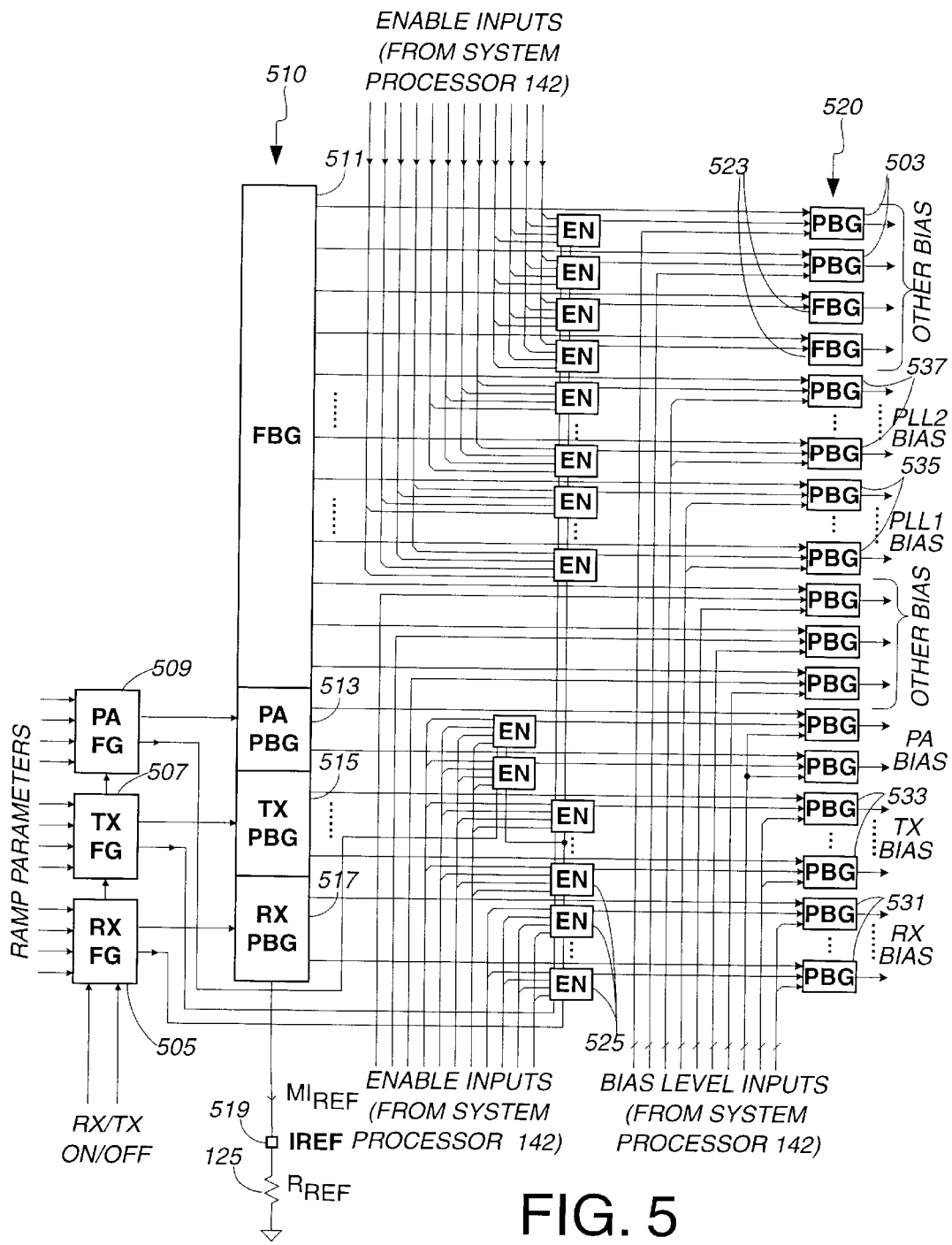
FIG. 5 shows a programmable bias current supply that includes control of the bias currents to the phase locked loop frequency synthesizers of FIG. 4 according to one embodiment of the invention.

FIG. 5 shows an embodiment of the bias current supply system 140. The bias supply is described more fully in U.S. Provisional Patent Application Serial No. 60/322,416 entitled CMOS WIRELESS TRANSCEIVER WITH PROGRAMMABLE CHARACTERISTICS, to Adams et al., filed: Sep. 14, 2001, incorporated herein by reference.

The maximum values of the bias currents are controlled by a set of slave programmable bias current generators (PBGs) 503 via the values in the registers that are input via transceiver SPI 151 (FIG. 1). Three digital programmable function generators RX-FG, TX-FG, and PA-FG independently control the switch-on and switch-off bias current for the receiver subcircuits, the transmitter front end subcircuits, and the transmit power amplifier subcircuits, respectively.

In one embodiment, the bias current supply system 140 includes two sets of bias current generators. The first set, referred to as the set 510 of master bias generators includes a fixed (master) bias generator FBG 511, and three programmable master generators, PA-PBG (513), TX-PBG (515), and RX-PBG (517) for the power amplifier, transmitter front end, and receiver subsystems, respectively.

Each master PBG in set 510 is controlled by the output—4-bits in one embodiment—of its respective function (e.g., ramp) generator. All the output currents of the fixed and programmable master generators are constant multiples of current $I_{REF}$, which in one embodiment is an M'th of the current sourced by an IREF pin 519 into off-chip resistor $R_{REF}$ 125.

Each of the second set (set 520) of current generators is referred to as a slave bias generator. In one embodiment, all the slave generators are programmable bias current generators such as slave PBG 503. In another embodiment, the second set 520 of slave generators also includes one or more fixed bias generators (FBGs) such as slave FBG 523. The outputs of these fixed and programmable slave generators supply individual analog subcircuits.

A set of slave PBGs 535 provides bias current to the subcircuits of PLL1 and another set 537 of slave PBGs provides bias current to the subcircuits of PLL2. Other FBGs or PBGs provide currents to the receiver subsystem, the transmitter front end, the power amplifiers, ADCs, DACs and other analog subcircuits. In one embodiment, each of the slave FBGs and slave PBGs has an enable input and a current input that is supplied by one of the outputs of the master bias generators. In one embodiment, the programmable slave generators have 1-bit digital control inputs from the digital system processor 142.

According to one aspect of the invention, the bias current from each of programmable slave generators 535 and 537 to at least some of the subcircuits in PLL1 and PLL2, respectively, is controlled by values in registers (called the bias control registers) of the set 137 of registers of the digital system processor 142.

Thus, while some embodiments, contexts, and applications have been described herein, the invention is not limited to those embodiments, contexts, and applications.

While one embodiment includes a digital subsection that has a programmable microcontroller (e.g., a microprocessor) with a RAM for program storage for controlling aspects of the chip including the programmable bias supply, other embodiments may include another type of digital subsection that does not use a programmable processor and RAM, for example a digital control circuit.

Embodiments described herein include a main bias current generator whose current is set by an external resistor. Other embodiments may use a different main bias generator, not necessarily set by an external resistor.

While one transceiver embodiment of the invention includes a superheterodyne receiver and a superheterodyne transmitter, other transceiver architectures may also benefit from the invention. For example, more or less than two oscillators may be present.

Furthermore, while one transceiver embodiment of the inventing is for half-duplex operation, the invention is not restricted to any particular mode of operation. Other modes of operation, including, for example, TDMA half-duplex and TDMA full-duplex may benefit from the invention.

While a transceiver embodiment for operation with RF frequencies in the 5 GHz range has been described, the invention may be embodied in transceivers operating in other RF frequency ranges. Furthermore, while a transceiver embodiment for operation conforming to the IEEE 802.11a standard has been described, the invention may be embodied in transceivers conforming to other standards and for other applications, including, for example, the IEEE 802.11b standard, other WLAN standards, bluetooth, GSM, PHS, and other cellular wireless telephony standards. Applications that can be accommodated by RF transceiver 401 are IEEE 802.11a COFDM wireless LANs and links, wireless Ethernet, Hiperlan I, Hiperlan II, European Technical Standards Institute (ETSI) broadband radio access network (BRAN), and multimedia mobile access communication (MMAC) systems, wireless local area networks, local multipoint distribution service (LMDS) IF strips, wireless digital video, wireless USB links, wireless IEEE 1394 links, TDMA packet radios, low-cost point-to-point links, voice-over-IP portable "cell phones" (wireless Internet telephones), etc.

Furthermore, while the embodiments described herein use a voltage controlled oscillator, different frequency synthesizer embodiments may be constructed using in general a signal controlled oscillator (SCO). The signal may be a current, or a voltage, so some other signal, and how to modify the VCO embodiments to operate with some other signal controlled oscillator, would be clear to those in the art and is intended to be covered by the invention.

Furthermore, while embodiments described herein are radio transceiver integrated circuits, the invention may be applied to other devices that require a PLL frequency synthesizer with reduced overall divide ratio. Furthermore, while embodiments described herein are for an integrated circuit that includes MOS transistors, the invention is not restricted to MOS transistor circuits. Furthermore, while CMOS embodiments are described herein, the invention is not restricted to a CMOS integrated circuit.

Thus, while there has been described what is believed to be the preferred embodiments of the invention, those skilled in the art will recognize that other and further modifications may be made thereto without departing from the spirit of the invention, and it is intended to claim all such changes and modifications as fall within the scope of the invention.

What is claimed is:

1. A phase locked loop (PLL) frequency synthesizer having a loop divide ratio and comprising:

a voltage controlled oscillator (VCO) to provide a VCO frequency signal;

a frequency offset circuit including a mixer accepting the VCO frequency signal and a signal from a second oscillator, and producing a shifted-frequency signal having a frequency significantly lower than the VCO output frequency;

a programmable divider accepting the shifted-frequency signal and dividing the frequency of the shifted-frequency signal by a settable amount;

a phase detector to compare the phase of the output of the programmable divider to that of a reference oscillator and produce a phase difference signal;

a loop filter to filter a function of the phase difference to produce a control input to the VCO, and a prescaler connected in parallel with the frequency offset circuit, with one or more switchable elements to switch between using the prescaler or the frequency offset circuit to produce a signal for the divider that has a frequency significantly lower than the VCO output frequency, wherein the offset circuit shifts down the frequency without increasing the divide ratio of the loop as would a prescaler achieving the same frequency conversion as the frequency offset circuit.

* * * * *

UNITED STATES PATENT AND TRADEMARK OFFICE
CERTIFICATE OF CORRECTION

PATENT NO. : 6,765,977 B1
DATED : July 20, 2004
INVENTOR(S) : Adams et al.

It is certified that error appears in the above-identified patent and that said Letters Patent is hereby corrected as shown below:

Column 9,
Line 1, please change the formula "$f_{LO2} = \frac{1}{2}\frac{N_1}{R_1} f_{CLK}$" in the third row to -- $f_{LO2} = \frac{1}{2}\frac{N_2}{R_2} f_{CLK}$ --.

Signed and Sealed this

Thirty-first Day of August, 2004

JON W. DUDAS
*Director of the United States Patent and Trademark Office*